(12) United States Patent
Masuda et al.

(10) Patent No.: US 7,361,926 B2
(45) Date of Patent: Apr. 22, 2008

(54) FIELD-EFFECT TRANSISTOR

(75) Inventors: Yuki Masuda, Tokyo (JP); Nobuo Kobayashi, Tokyo (JP)

(73) Assignee: TDK Corporation, Tokyo (JP)

( * ) Notice: Subject to any disclaimer, the term of this patent is extended or adjusted under 35 U.S.C. 154(b) by 343 days.

(21) Appl. No.: 10/535,412

(22) PCT Filed: Jun. 24, 2004

(86) PCT No.: PCT/JP2004/008895

§ 371 (c)(1),
(2), (4) Date: May 18, 2005

(87) PCT Pub. No.: WO2005/001940

PCT Pub. Date: Jan. 6, 2005

(65) Prior Publication Data

US 2006/0043359 A1   Mar. 2, 2006

(30) Foreign Application Priority Data

Jun. 27, 2003   (JP)   ............................. 2003-185593

(51) Int. Cl.
*H01L 29/08* (2006.01)
*H01L 35/24* (2006.01)
*H01L 51/00* (2006.01)

(52) U.S. Cl. .......................................... 257/40; 438/99

(58) Field of Classification Search .................. 257/40
See application file for complete search history.

(56) References Cited

U.S. PATENT DOCUMENTS

| 2003/0071259 A1* | 4/2003 | Yoshida ......................... 257/40 |
| 2005/0045876 A1* | 3/2005 | Fukui ............................ 257/40 |
| 2005/0104058 A1* | 5/2005 | Veres et al. .................... 257/40 |

FOREIGN PATENT DOCUMENTS

| JP | A-06-180456 | 6/1994 |
| JP | A-08-191162 | 7/1996 |
| JP | A-09-167764 | 6/1997 |
| JP | B2-2984370  | 9/1999 |

* cited by examiner

Primary Examiner—Jerome Jackson
Assistant Examiner—Anthony Ho
(74) Attorney, Agent, or Firm—Oliff & Berridge, PLC (57) ABSTRACT

An organic FET 1 comprises a substrate 2 on which a gate insulation film 41 and a reformed layer 43 are formed in this order, and a source electrode 6 and a drain electrode 8 are further arranged thereon at a predetermined distance from each other, and furthermore, an organic semiconductor layer 10 is formed on and between the electrodes 6 and 8. The reformed layer 43 fixed on the gate insulation film 41 and attached to the organic semiconductor layer 10 contains a specific compound containing the CN group or is composed of only a specific compound containing the CN group.

11 Claims, 8 Drawing Sheets

FIELD-EFFECT TRANSISTOR

TECHNICAL FIELD

This application is the U.S. National Stage of PCT/JP04/08895, filed Jun. 24, 2004, which claims priority from Japanese Application No. JP2003-185593, filed Jun. 27, 2003, the disclosures of which are incorporated herein in their entireties by reference thereto.

The present invention relates to a field-effect transistor (FET) and, more particularly, to an FET comprising semiconductor layers containing organic substances.

BACKGROUND ART

Generally, in the case of a thin film organic FET using organic semiconductors, organic semiconductor layers can be formed by a simple process such as a printing method, a spray method, or an ink-jet method, therefore, the cost is considerably lower than that of an FET using inorganic semiconductors. Moreover, since there is a possibility that a light and thin integrated circuit having a large area may be formed easily, the application thereof to a liquid crystal display, an organic EL display, an IC card, etc., is expected.

Recently, the mobility of carrier of the organic semiconductor is increased and those having the mobility of carrier as high as that of the amorphous silicon have been found. The research on how to put to practical use an FET using organic semiconductors having such a high mobility is extensively being carried out. Specifically, organic materials that exhibit a high mobility and are currently available include pentacene, polyalkylthiophene, etc., as a result, a great progress in the development of the organic FETs has been found.

However, even though these materials are used, such a high mobility as that of the amorphous silicon can be obtained only when the materials are molecular substances and are used in the form of a single crystal. If the entire semiconductor layer is made up of a single crystal, it is extremely difficult to manufacture a large integrated circuit at a low cost. On the other hand, organic semiconductors made of polycrystalline and amorphous polymers cannot be put to practical use because of the mobility incommensurably lower than that of a single crystal due to, for example, the loss of scattered electrons at grain boundaries. Therefore, in order to prevent a material from being brought into a polycrystalline state, in other words, to prevent occurrence of crystal defects, a considerable amount of man-hours are paid for purification of the material to reduce the concentration of impurities in an organic semiconductor layer as much as possible.

In order to solve these problems, a proposal is made in which the mobility of a sexithiophene evaporated film, which is an organic semiconductor layer, is increased by using cyanoethyl pullulan as a material for a gate insulation film in an FET structure (refer to Patent document 1).

Patent document 1: Japanese Patent No. 2984370

DISCLOSURE OF THE INVENTION

Problem to be Solved by the Invention

However, the inventors of the present invention examined in detail the characteristics of the conventional organic FET described above, in which cyanoethyl pullulan was used for a gate insulation film, and found the following problems. As described in Patent document 1 described above, if cyanoethyl pullulan is used for a gate insulation film, the drain current can be increased but the responsiveness to the increase/decrease in the drain current to the change of the gate voltage and the stability are insufficient. Specifically, according to the additional test conducted by the inventors of the present invention, it was found that after the application of the gate voltage, it took more than tens of seconds until the drain current was stabilized. Moreover, an unstable behavior was observed, in which the drain current that had gradually increased began to decrease as time elapsed.

When the responsiveness to the drain current to the change of the gate voltage and the stability are insufficient, it is actually extremely difficult to control the current flowing between the source electrode and the drain electrode to a desired quantity using the gate voltage and it is substantially impossible to obtain desired transistor characteristics. In other words, in the case of the conventional organic FET in which cyanoethyl pullulan is used for a gate insulation film, the effect of the increase in the drain current is marked and it may not be possible to realize a practical organic FET without changing the conventional configuration.

The conventional organic FETs other than those described above have a problem in that the current having flowed once decreases gradually as time elapses (for example, several seconds to several minutes), which is a characteristic inherent in an organic semiconductor layer, and because of the low mobility, it is extremely difficult to obtain a sufficient quantity of the drain current.

The above-mentioned problem being taken into consideration, the present invention has been developed and an object thereof is to provide an FET capable of preventing the change of the drain current as time elapses after the application of the gate voltage and obtaining a stable drain current for a long time.

Means for Solving Problem

In order to attain the above-mentioned object, the inventors of the present invention focused on the physical properties of a gate insulation film adjacent to an organic semiconductor layer and as a result of an intensive study, it was found that a drain current-gate voltage characteristic different from the conventional one could be obtained by providing a specific substance at the boundary surface between the organic semiconductor layer and the gate insulation film or in the vicinity thereof not on purpose to maintain the insulation nor to just increase the drain current. Based on this acquired knowledge, the inventors of the present invention further developed the research and finally completed the present invention.

An FET according to the present invention is characterized by comprising a gate electrode formed at one side of a base substrate, a source electrode formed at the one side of the base substrate, a drain electrode formed at the one side of the base substrate, an insulation layer formed between the gate electrode and the source electrode and between the gate electrode and the drain electrode, an organic semiconductor layer formed around (at the periphery of) the source electrode and the drain electrodes, and a reformed layer attached between the insulation layer and the organic semiconductor layer and containing a compound having the CN group in a molecule. The base substrate may be one that doubles as a gate electrode. Moreover, the reformed layer may be one attached between the insulation layer and the organic semiconductor layer and composed of only a compound having the CN group in a molecule.

According to the FET having the above-mentioned configuration, it is confirmed that a stable drain current can be obtained despite an elapse of time because the reformed layer provided so as to be interposed between the insulation layer and the organic semiconductor layer contains a compound having the CN group (hereinafter, referred to as the specific compound containing the CN-group) in the molecule.

The details of the mechanism that brings about the function and effect described above are not made clear yet but if the fact is taken into consideration that no significant effect can be obtained from a structure in which the order of lamination of the insulation layer and the reformed layer is reversed, that is, a structure in which the insulation layer is provided between the reformed layer and the organic semiconductor layer, it can be thought that the function and effect is due to the interaction between the material making up the organic semiconductor layer and the specific compound containing the CN group at the boundary surface between the organic semiconductor layer and the reformed layer.

More specifically, when the inventors of the present invention measured, using the method to be described later, the drain current-time characteristic of an FET not comprising a reformed layer, that is, an FET in which an organic semiconductor layer composed of pentacene etc. was formed directly on an insulation film composed of a thermally-oxidized silicon film ($SiO_2$ film), it was found that the drain current decreased considerably as time elapsed. Moreover, it was found that the above-mentioned trend of the drain current in the decreasing direction was halted by the application of a reverse bias to the gate electrode. From these facts, it can be estimated that if the drain current flows, charges become more likely to be captured by the trap level of the organic semiconductor layer and the drain current decreases markedly mainly because carriers in the channel undergo Coulomb scattering caused by the charges. However, the functions are not limited to these.

In contrast to this, it can be estimated that if the specific compound containing the CN group is contained in the reformed layer, charges that can be captured by the trap level of the organic semiconductor layer are caused to move so as to be injected into the specific compound containing the CN group from the vicinity of the boundary surface between the organic semiconductor layer and the insulation layer. It can be thought that because of the above, the extent to which the carriers in the channel undergo Coulomb scattering is reduced drastically and the drain current is prevented from markedly decreasing as time elapses. However, the functions are not limited to these.

In the manufacture of an FET having such a structure, an organic semiconductor layer is formed on a reformed layer by crystal growth etc., but in this case, the top surface of the reformed layer is a field for new creation. Conventionally, the insulation layer is the new creation field, therefore, there is a possibility that the state of the crystallinity and the crystal in the vicinity of the above-mentioned boundary surface of the organic semiconductor layer may differ from the conventional state, and it can be estimated that this may contribute to the stabilization of the drain current described above. However, the functions are not limited to these.

Specifically, it is preferable for the specific compound containing the CN group contained in the reformed layer to be expressed by the following chemical formula 1.

[Chemical Formula 1]

In the chemical formula, $R^1$ represents the alkylene group or the polymethylene group whose carbon number k is 1 to 20 and the alkylene group and the polymethylene group may have an ether linkage, n represents an integer of 1 to 2k, $R^2$, $R^3$, and $R^4$ each represent an organic group whose carbon number is 1 to 20 independently of each other and at least one of $R^2$, $R^3$, and $R^4$ is the alkoxy group whose carbon number is 1 to 5 or the alkylamino group having an alkyl chain whose carbon number is 1 to 20, and M represents at least one kind of atom of Si, Ti, and Al. When M is Si or Ti, m=1 and when M is Al, m=0.

According to the knowledge of the inventors of the present invention, it can be estimated that charges tend to move excessively from the organic semiconductor layer into the reformed layer depending on the kind of the specific compound containing the CN group and the concentration of the compound contained in the reformed layer. Due to this, the state of charges in the vicinity of the channel becomes unstable and it can be thought that the drain current becomes unstable as a result.

In contrast to this, one of the specific compounds containing the CN group, which is expressed by the chemical formula 1, is a so-called silane coupling agent modified by the CN group, and it can be considered that the use thereof for the reformed layer properly prevents charges from being injected excessively into the reformed layer and as a result, the state of charges in the vicinity of the channel can be prevented from becoming unstable.

In particular, it is preferable for the reformed layer to contain 2-cyanoethyltriethoxy silane as the specific compound containing the CN group. The 2-cyanoethyltriethoxy silane is more frequently used in the industry and more readily available in the market than other specific compounds containing the CN group and, at the same time, by using this, it is possible to enhance the stability of the drain current to a sufficient level.

Moreover, it is preferable for the concentration of the specific compound containing the CN group contained in the reformed layer to be less than 83 mass %, or much preferably, 5 to 50 mass %.

If the concentration is equal to or greater than 83 mass %, the drain current tends to increase/decrease extremely as time elapses when a constant gate voltage is applied continuously and as a result, the change in width of the drain current becomes markedly large. This can be considered because the specific compound containing the CN group is contained in the reformed layer in a state of being properly diluted and charges are prevented from being injected excessively from the organic semiconductor layer to the reformed layer. If the concentration is between 5 to 50 mass %, the variations in the drain current can be suppressed more strongly and the mobility in the organic semiconductor layer tends to be increased significantly and sufficiently and, as a result, the drain current can be increased sufficiently.

Moreover, it is preferable for the reformed layer to have a thickness of 0.5 to 500 nm, or much preferably, 0.5 to 100 nm.

When the thickness is less than 0.5 nm, it tends to become more difficult to form a reformed layer having a sufficiently-enhanced uniformity of thickness in the plane. However, it is preferable for the thickness of the layer to be uniform, but it dose not matter even if there is a small defective portion such as a pin hole in the reformed layer.

On the other hand, under the conditions that the above-mentioned excessive injection of charges can be caused, or more specifically, in a state in which cyanoethyl pullulan is used for an insulation layer as conventionally, the inventors of the present invention varied the thickness of the cyanoethyl pullulan variously to manufacture an organic FET having a structure in which an organic semiconductor layer made of pentacene is attached on the cyanoethyl pullulan film. Then the inventors measured the electrostatic capacitance-gate voltage characteristic, which will be described later, for each obtained organic FET. Moreover, the inventors measured the change of the drain current with elapsed time in a state in which a constant drain voltage was applied.

As a result, it is confirmed that in the case of an FET in which the electrostatic capacitance when a negative bias gate voltage is applied to the gate electrode exceeds a value twice or greater than the electrostatic capacitance when a positive bias gate voltage is applied, the variations in the drain current cannot be suppressed sufficiently and the film thickness of the cyanoethyl pullulan at this time is about 1,000 nm. Based on this fact, it can be supposed that if the thickness of the reformed layer exceeds about 500 nm, it tends to become more difficult to sufficiently suppress the gate voltage dependency of the electrostatic capacitance of the FET and to sufficiently prevent the variations in the drain current. It can be estimated that one of the main reasons for the above-mentioned trend is that the charges become more likely to be injected excessively into the reformed layer described above when the thickness of the reformed layer becomes excessively great.

In other words, it is preferable for the electrostatic capacitance to satisfy the relationship expressed by the following expression (mathematical expression 1).

$$C_{max} \leq C_{min} \times 2$$

In the expression, $C_{min}$ indicates the minimum value of the electrostatic capacitance in the electrostatic capacitance-gate voltage characteristic of the FET and $C_{max}$ indicates the maximum value of the electrostatic capacitance in the electrostatic capacitance-gate voltage characteristic of the FET.

The electrostatic capacitance-gate voltage characteristic (so-called C-V characteristic) in the present invention is obtained by continuously applying a negative bias from 10 V to −10 V to the gate electrode and measuring the electrostatic capacitance between the source electrode and the gate electrode or between the drain electrode and the gate electrode at a measurement frequency of 1 Hz to 1 kHz. Normally, $C_{min}$ is an electrostatic capacitance obtained when a positive bias is applied to the gate electrode. In the configuration of an FET when this characteristic is measured, the gate electrode may be arranged in opposition to the source electrode or the drain electrode, or may be not so arranged.

On the other hand, it is preferable that the curve of the rate of change of the drain current obtained from the drain current-gate voltage characteristic has a local extreme value, the first derivative is substantially positive, or the rate of change exceeds 1 when 10 seconds elapse after the gate voltage is applied.

The drain current-time characteristic (so-called I-t characteristic) in the present invention represents the change of the drain current continuously or intermittently measured during the period of time from the start of application (t=0) until $10^4$ seconds elapse in a state in which a constant gate voltage is applied continuously to the gate electrode. The curve of the rate of change of the drain current represents a curve obtained by normalizing the current values in the drain current-gate voltage characteristic thus obtained to current values at t=0. The state in which the first derivative is substantially positive represents a state in which the rate of change of the drain current increases linearly or nonlinearly without decreasing significantly in the curve of the rate of change of the drain current.

When the curve of the rate of change of the drain current is expressed in the form of a function exhibiting such a characteristic, it is confirmed that the absolute value of the width of variations in the drain current with elapsed time can be suppressed to a sufficiently small value.

Moreover, it is preferable for the insulation layer to be one, to the surface or the surface layer of which, the hydroxyl group has been introduced. When the reformed layer is fixed on the insulation layer by carrying out the drying process etc. of a solution-applied film formed by the application of a solution, it is preferable if the hydroxyl group (—OH) has been introduced in advance to the surface or the surface layer of the insulation layer because the adhesion of the reformed layer to the insulation layer can be further enhanced.

EFFECT OF THE INVENTION

As explained above, according to the organic FET of the present invention, because of the reformed layer containing the specific compound containing the CN group, it is possible to suppress the change of the drain current with elapsed time after the gate voltage is applied and obtain a stable drain current for a long time.

EXPLANATION OF REFERENCE NUMERALS 1 organic FET (FET)
2 substrate (base substrate, gate electrode)
4 composite layer
6 source electrode
8 drain electrode
10 organic semiconductor layer
41 gate insulation film (insulation layer)
43 reformed layer

BEST MODES FOR CARRYING OUT THE INVENTION

Embodiments of the present invention are explained in detail with reference to the drawings. It is assumed that the positional relationship among upper, lower, right, and left parts corresponds to that shown in the drawings.

Figure 1:
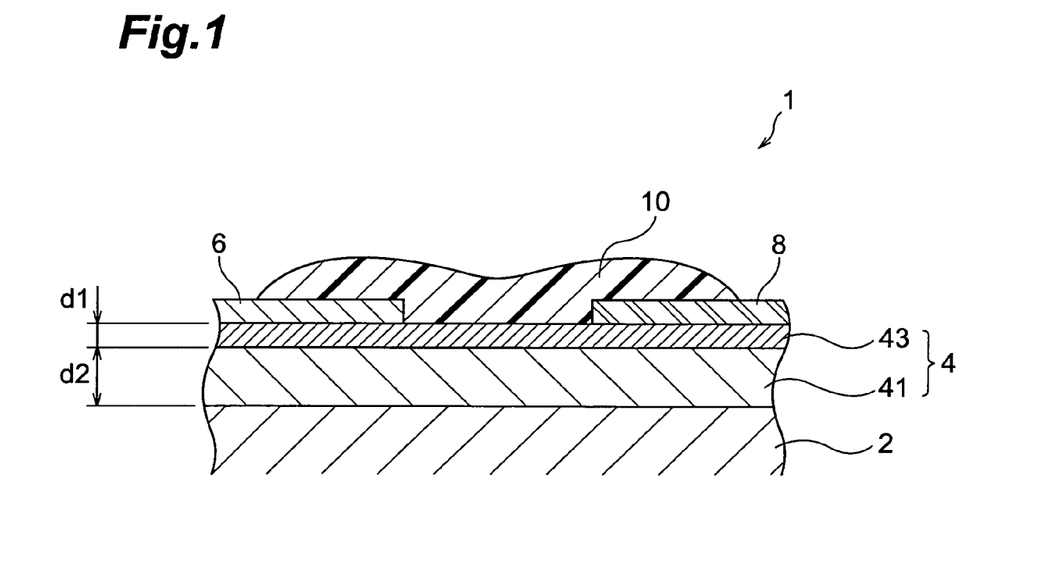
FIG. 1 is a sectional view schematically showing an important part of a configuration of an FET according to the present invention.

FIG. 1 is a sectional view schematically showing an important part in a configuration of an FET of the present invention. An organic FET (field-effect transistor) 1 comprises a substrate 2 (base substrate) on which a composite layer 4 composed a gate insulation film 41 (insulation layer) made of an insulation material and a reformed layer 43 are formed in this order, and a source electrode 6 and a drain electrode 8 are further arranged thereon at a predetermined distance from each other, and furthermore an organic semiconductor layer 10 is formed on and between the electrodes 6 and 8.

The arrangement of the organic semiconductor layer 10 is not limited to that shown schematically. For example, an organic FET having a structure, in which the organic semiconductor layer 10 is formed on the reformed layer 43 and the source electrode 6 and the drain electrode 8 are formed on the organic semiconductor layer 10 at a predetermined distance from each other, is included in the FETs of the present invention.

The substrate 2 shown in FIG. 1 is made of a conductive material such as polysilicon or doped Si, and doubles as a gate electrode. However, a substrate having the insulating properties made of a material such as glass, ceramics, or plastic can be used and in such a case, it is necessary to provide a gate electrode separately in order to maintain the insulation among the source electrode 6, the drain electrode 8, and the organic semiconductor layer 10. Moreover, materials of the organic semiconductor layer 10 are not limited in particular provided the materials are organic substances having the semiconductor characteristic that can realize a channel structure, and for example, a polycyclic compound (acene) composed of four/five or more ortho condensed benzene rings in a linear arrangement such as pentacene or tetracene, polyalkylthiophene, thiophene oligomer, etc., can be used.

The gate insulation film 41 is made of various materials that exhibit a proper dielectric constant and specifically, the materials include an inorganic dielectric such as $SiO_2$, $Al_2O_3$, $Si_3N_4$, or $TiO_2$, an organic polymer such as polyimide, Mylar, polyvinylidene fluoride, polymethylmethacrylate, etc.

The reformed layer 43 is composed of a specific compound containing the CN group, to be described later, or is prepared by solidifying a polymer, which is a matrix material (base material), in a state in which the specific compound containing the CN group is dissolved, dispersed, or mixed therein. Polymers for the matrix material are not limited in particular provided the specific compound containing the CN group can be easily dissolved, dispersed, or mixed therein, as will be described later, the polymers can be easily dissolved in solvents as the need arises, and the solution thereof can be easily applied, including, for example, an acrylic resin.

Preferably, acrylic resins are polymers of (meth)acrylic acid ester base monomers, or more specifically, polyalkyl (meth)acrylate such as polymethyl(meth)acrylate (PMMA), polyethyl(meth)acrylate, poly n-propyl(meth)acrylate, poly n-butyl(meth)acrylate, polyisobutyl(meth)acrylate, or polytertiary butyl(meth)acrylate, multifunctional (meth)acrylate polymers, modified (meth)acrylate polymers, etc.

Resins other than the acrylic resins include, for example, copolymers of (meth)acrylic acid ester base monomer and monomer other than this, and more specifically, polymers of acrylamide group, polymers of aromatic vinyl compounds, etc. Moreover, examples include polyethylene terephthalate, polyethylene, polypropylene, polyvinyl chloride, various polyester carbonate groups, polyurethane group, epoxy resin group, etc.

The specific compound containing the CN group is not limited in particular provided the CN group is contained in a molecule, and an example is a silane coupling agent modified by the CN group expressed by the following (chemical formula 1) described above.

[Chemical Formula 2]

An example of such a material is a polymer containing the cyanoalkyl group expressed by the following (chemical formula 2).

[Chemical formula 3]

Here, (in chemical formula 1), $R^1$ represents the alkylene group or the polymethylene group whose carbon number k is 1 to 20 and the alkylene group and the polymethylene group may have an ether linkage, n represents an integer of 1 to 2k, $R^2$, $R^3$, and $R^4$ each represent an organic group whose carbon number is 1 to 20 independently of each other and at least one of $R^2$, $R^3$, and $R^4$ is the alkoxy group whose carbon number is 1 to 5 or the alkylamino group having an alkyl chain whose carbon number is 1 to 20, and M represents at least one kind of atom of Si, Ti, and Al. When M is Si or T, m=1 and when M is Al, m=0.

In chemical formula 2, at least one of $R^5$ is the cyanide organic group such as a cyanoalkyl group, such as a cyanoethyl group, or a cyanoalkoxyalkyl group (ether linkage may be contained or may be not), and the rest represents the hydrogen atoms. Moreover, n is an integer between 1 and 20.

Among those, one expressed by chemical formula 1 and the polymer (cyanoethyl pullulan) expressed by chemical formula 2 in which at least one of $R^5$ is the cyanoethyl group are preferable, and among those expressed by chemical formula 1, the 2-cyanoethyltriethoxy silane is much preferable.

The reformed layer 43 may not contain a polymer as a matrix material but one containing the polymer can be used preferably. In this case, the concentration of the specific compound containing the CN group is preferably less than 50 mass %, and much preferably, 5 to 25 mass %. Moreover, although the thickness d1 of the reformed layer 43 is not limited in particular, the thickness is preferably 0.5 to 500 nm, and much preferably, 0.5 to 100 nm.

The thickness d1 of the reformed layer 43 may be designed properly in relation to the thickness d2 of the gate insulation film 41 and it is preferable for the thickness d1 to be set so as to satisfy, for example, the relationship expressed by the following (mathematical expression 2).

$$d2 \times 0.0005 \leq d1 \leq d2 \times 10$$

It is much preferable for the thickness d1 of the reformed layer 43 to be set so as to satisfy the relationship expressed by the following (mathematical expression 3).

$$d2 \times 0.0005 \leq d1 \leq d2 \times 1$$

An example of a procedure of manufacturing the organic FET 1 thus configured is explained below. First, an n-type silicon substrate (for example, bulk resistivity: about 10 Ωcm) is prepared as the substrate 2, and the substrate 2 is thermally oxidized according to circumstances to form the gate insulation film 41 composed of a thermally-oxidized film ($SiO_2$ film) having a thickness of about 200 nm.

Next, a solution is prepared, which is an organic solvent in which the polymer for the matrix material and the specific compound containing the CN group are dissolved, or the compound containing the CN group alone is dissolved. Organic solvents are not limited in particular provided the polymer and the specific compound containing the CN group can be readily dissolved and dispersed therein. For example, the alcohol group, the ether group, the ketone group, the ester group, the glycol ether group, aromatic compounds, petroleum ether, etc., and according to circumstances, monomers of the same kind of the polymer, for example, (meth)acrylic acid ester group, aromatic vinyl compounds, etc, can be used.

Next, the reformed layer 43 is formed using the solution thus prepared. The following two kinds of method are shown as specific methods for forming the reformed layer 43.

In the first method, the solution prepared as described above is applied onto the gate insulation film 41 on the substrate 2. As an application method of the solution, application methods of spin-coating, roll-coating, die-coating, bar-coating, dip-coating, etc., can be used according to circumstances. The solution-applied film thus formed on the gate insulation film 41 is made to undergo drying under reduced pressure at temperatures between 60 and 200° C. for, for example, 10 minutes to 10 hours, thereby the reformed layer 43 is obtained. At this time, the prepared solution for application may contain a polymer for a matrix material.

In the second method, first the substrate 2 having the gate insulation film 41 is soaked in the solution prepared as described above. The solution-applied film thus obtained is heated at temperatures, for example, between 70 to 200° C. for, for example, 10 minutes to 10 hours to make the gate insulation film to react with the gate insulation film 41, thereby the film is fixed on the gate insulation film 41 and the reformed layer 43 is formed. At this time, it is preferable that prior to the formation of the reformed layer 43, the surface of the substrate 2 on which the gate insulation film 41 is formed be made to undergo the hot watering treatment to properly introduce the hydroxyl group to the surface or the surface layer of the gate insulation film 41. In this way, the reaction between the solution-applied film and the gate insulation film 41 is promoted during the period of heating process and the adhesion of the reformed layer 43 is improved. Next, after the heating process for forming the reformed layer 43 is completed, it is preferable to remove the unreacted specific compound containing the CN group contained in or attached to the reformed layer 43 by cleaning the surface of the reformed layer 43.

Further, the source electrode 6 and the drain electrode 8 are formed by metal vapor deposition of Au etc. After this, the material of the organic semiconductor layer 10 described above is attached to the periphery of both the electrodes 6 and the electrode 8 by the vapor deposition method etc. so that the thickness is about 50 nm to form the organic semiconductor layer 10 and thus the organic FET 1 is obtained. The channel length is set to about 20 μm and the channel width is set to, for example, about 5 mm.

In order to manufacture the organic FET 1 having the above-mentioned configuration in which the organic semiconductor later 10 is provided on the reformed layer 43 and the source electrode 6 and the drain electrode 8 are formed thereon, after the reformed layer 43 is formed by application of the solution and the heating process of the solution-applied film, the organic semiconductor layer 10 is evaporated, and both the electrode 6 and the electrode 8 are formed thereon by metal vapor deposition.

It is preferable for the organic FET 1 having the above-mentioned configuration thus obtained to satisfy the relationship expressed by the following (mathematical expression 1) described above.

$$C_{max} \leq C_{min} \times 2$$

In the expression, $C_{min}$ represents the minimum value of the electrostatic capacitance in the electrostatic capacitance-gate voltage characteristic of the organic FET 1 and $C_{max}$ represents the maximum value of the electrostatic capacitance in the electrostatic capacitance-gate voltage characteristic of the organic FET 1.

On the other hand, the organic FET 1 is useful if the curve of the rate of change of the drain current obtained from the drain current-time characteristic has a local extreme value, the first derivative is substantially positive, or the rate of change exceeds 1 when 10 seconds elapse after the gate voltage is applied.

In the organic FET 1 thus configured, since the specific compound containing the CN group is contained in the reformed layer 43, the charges that can be captured by the trap level that appears in the organic semiconductor layer 10 can be caused to move so as to be injected from the vicinity of the boundary surface between the organic semiconductor layer 10 and the gate insulation film 41 to the specific compound containing the CN group. Due to this, Coulomb scattering the carriers in the channel structure would undergo, if charges were captured by the trap level, is reduced drastically. Therefore, the drain current can be sufficiently prevented from markedly decreasing as time elapses in the organic FET 1.

If the specific compound containing the CN group is such one expressed by chemical formula 1, it becomes easier to prevent the charges from excessively moving from the organic semiconductor layer 10 to the reformed layer 43 and the problem of the formation of a significant amount of holes in the channel from arising. Therefore, the state of the charges in the vicinity of the channel can be kept stable and the variations in the drain current can be prevented much efficiently than before.

EXAMPLES

The present invention is explained in detail below with reference to examples, but the present invention is not limited to these examples.

Example 1

A highly-doped n-type silicon (bulk resistivity: 10 Ωcm) substrate that doubles as a gate electrode, on which a thermally-oxidized film having a thickness of about 400 nm is formed as a gate insulation film, is prepared and is cut into a 25 mm by 10 mm rectangle. On the other hand, a polymer mixture of PMMA and CR-S (cyanoethyl pullulan-S type) manufactured by Shin-Etsu Chemical Co., Ltd. is dissolved in a solvent (acetone: methyl ethyl ketone: acetonitrile=2:1:1) so that the concentration of the polymer is 1 wt %, and thus a solution is obtained. This solution is spin-coated to a silicon chip at a rotation speed of 1,000 rpm, and then is made to undergo drying under reduced pressure at 80° C. for an hour, and thus a reformed layer is obtained. The thickness of the obtained reformed layer is 50 nm.

Then, pentacene, which is a material of an organic semiconductor layer, is evaporated onto the reformed layer at a film forming speed of 0.1 nm/sec, and thus an organic semiconductor layer having a thickness of about 50 nm is formed. Further, an Au film having a thickness of about 100 nm is evaporated onto the organic semiconductor layer and a source electrode and a drain electrode are formed, and thus an organic FET is obtained. By the way, the channel length is set to 20 μm and the channel width is set to 5 mm. In the present example 1, plural organic FETs having different concentrations of CR-S contained in the reformed layer (9 mass %, 23 mass %, 50 mass %, 83 mass %, and 100 mass %; 100 mass % means that the mass % of PMMA=0, that is, the reformed layer is made of only CR-S) are manufactured by properly varying the amount of PMMA and CR-S dissolved in a 10% ethanol solution.

Comparative Example 1

An organic FET is obtained in the same manner as that in the example 1 except in that an application solution is prepared without using CR-S, that is, a layer made of only PMMA not containing the specific compound containing the CN group is formed on a gate insulation film. In other words, the layer on the insulation layer in the FET in the comparative example 1 is made of 100 mass % PMMA.

Example 2

Plural organic FETs having the reformed layer of which differs in thickness variously (10 nm, 29 nm, 98 nm (two), and 1,100 nm) are manufactured in the same manner as that in the example 1 except in that a solvent in which acetonitrile: N,N'-dimethylformamide=1:1 is used and that the conditions of drying under reduced pressure after the spin-coat are that the temperature is 120° C. and the time is one hour. At this time, the concentration of CR-S contained in the reformed layer is fixed to 100 mass %. The channel length of the organic FET having a thickness of 10 nm is set to 50 μm.

Comparative Example 2

An organic FET is manufactured in the same manner as that in the example 2, by which the organic FET having the reformed layer of which has a thickness of 1,100 nm is obtained, except in that a gate insulation film is not provided, that is, a CR-S layer having a thickness of 1,100 nm is formed as an insulation layer.

Example 3

A silicon substrate chip similar to that in the example 1 is left in a boiling water for five hours. Next, each of the silicon substrate chips is soaked in a solution of 10 mass % ethanol of 2-cyanoethyltriethoxy silane for one hour and a dehydration polymerization reaction is caused to occur by keeping it in a state of being heated to 100° C. Then, each silicon substrate chip is cleaned with ethanol and is made to undergo drying under reduced pressure at 80° C. for one hour after the 2-cyanoethyltriethoxy silane that has not reacted is removed, and thus a reformed layer is obtained. The thickness of the obtained reformed layer is 1 to 2 nm.

Comparative Example 3

An organic FET is obtained in the same manner as that in the example 3 except in that an application solution is prepared without using 2-cyanoethyltriethoxy silane.

<Characteristic Evaluation 1>

Figure 2:
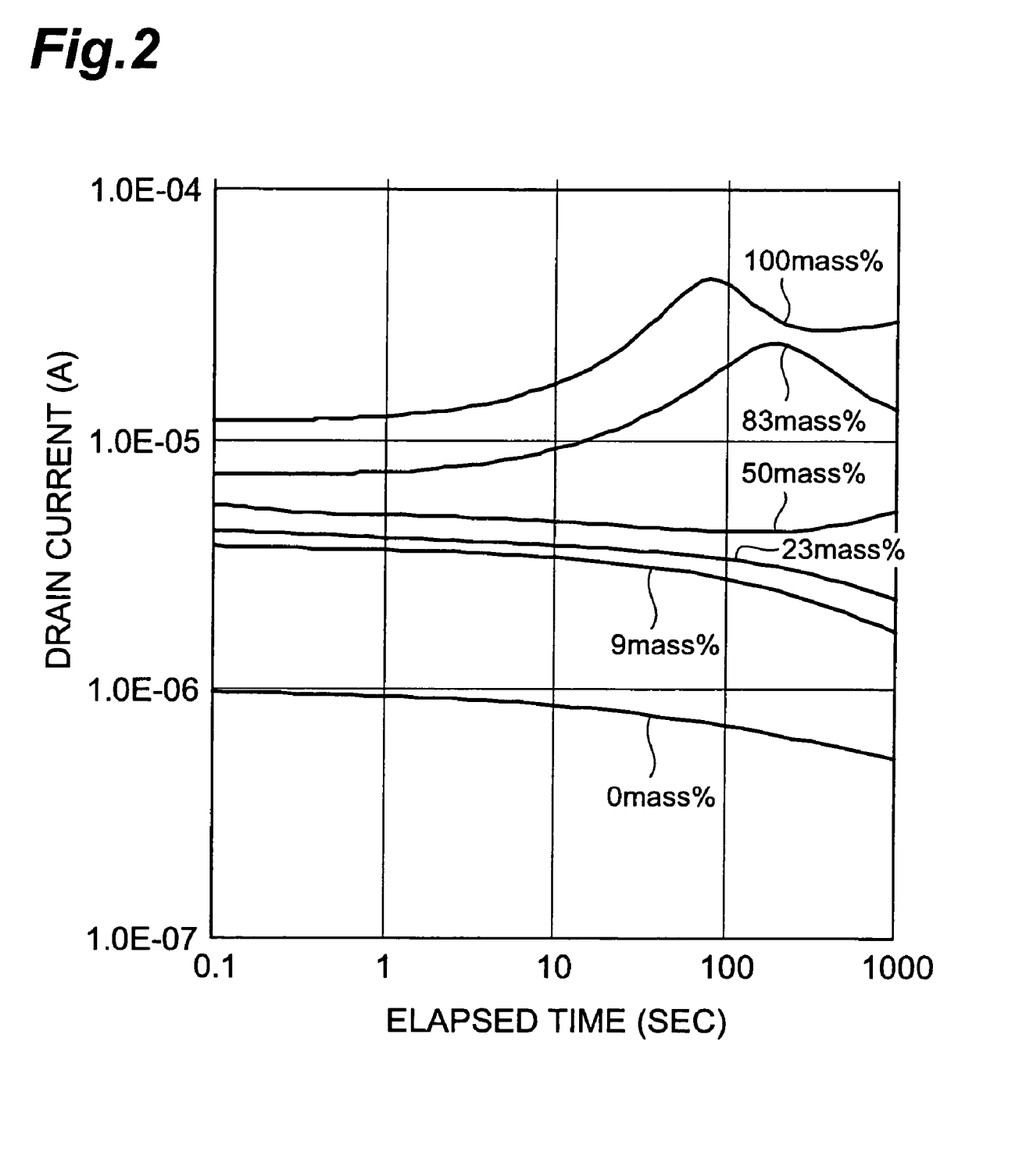
FIG. 2 is a graph showing the drain current-time characteristic of each organic FET obtained in an example 1 and a comparative example 1.
Figure 3:
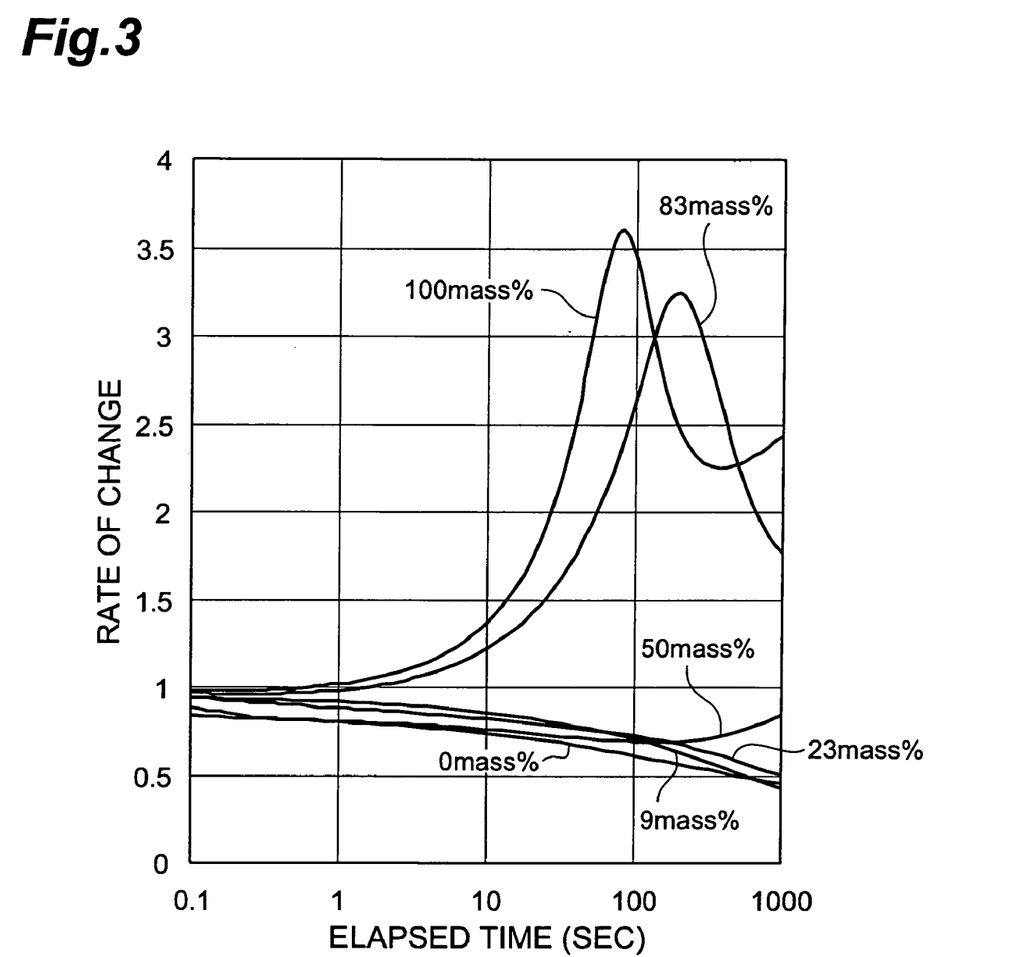
FIG. 3 is a graph showing the rate of change of the drain current values versus elapsed time, the drain current values being obtained by normalizing the drain currents shown in FIG. 2 to the initial values (drain currents when voltage is applied)

The drain current-time characteristic (I-t characteristic) of each organic FET obtained in the example 1 and in the comparative example 1 is measured by the above-mentioned method. The result is graphed and shown in FIG. 2. In the figure, the values denoted in units of mass % represent the concentration of CR-S in the reformed layer. FIG. 3 is a graph showing the change of the drain current values normalized to the initial values (drain current when voltage is applied), that is, the rate of change of the drain current with respect to elapsed time.

From these results, an increase in the drain current due to the presence of the reformed layer containing CR-S on the insulation film is recognized. Moreover, it is found that during the period of time from the application of the gate voltage until about $10^3$ seconds elapse, the rate of change of the drain current remains in the range between about −0.5 and 1.2 compared to the initial value. As shown in FIG. 3, when the concentration of CR-S is equal to or greater than 83 mass %, a local maximum is recognized in the graph showing the rate of change of the drain current. However, when the concentration is 5 to 50 mass %, no local maximum is recognized in the graph showing the rate of change of the drain current and it is understood that the variation width thereof can be reduced comparatively and it is found that the absolute value can be increased properly. Moreover, it is also confirmed that the drain current is small in the organic FET in the comparative example 1, when the concentration of CR-S is equal to or greater than 83%, the change of the drain current in a short time is considerably large, and the trend in the decreasing direction after the local maximum is marked.

<Characteristic Evaluation 2>

Figure 4:
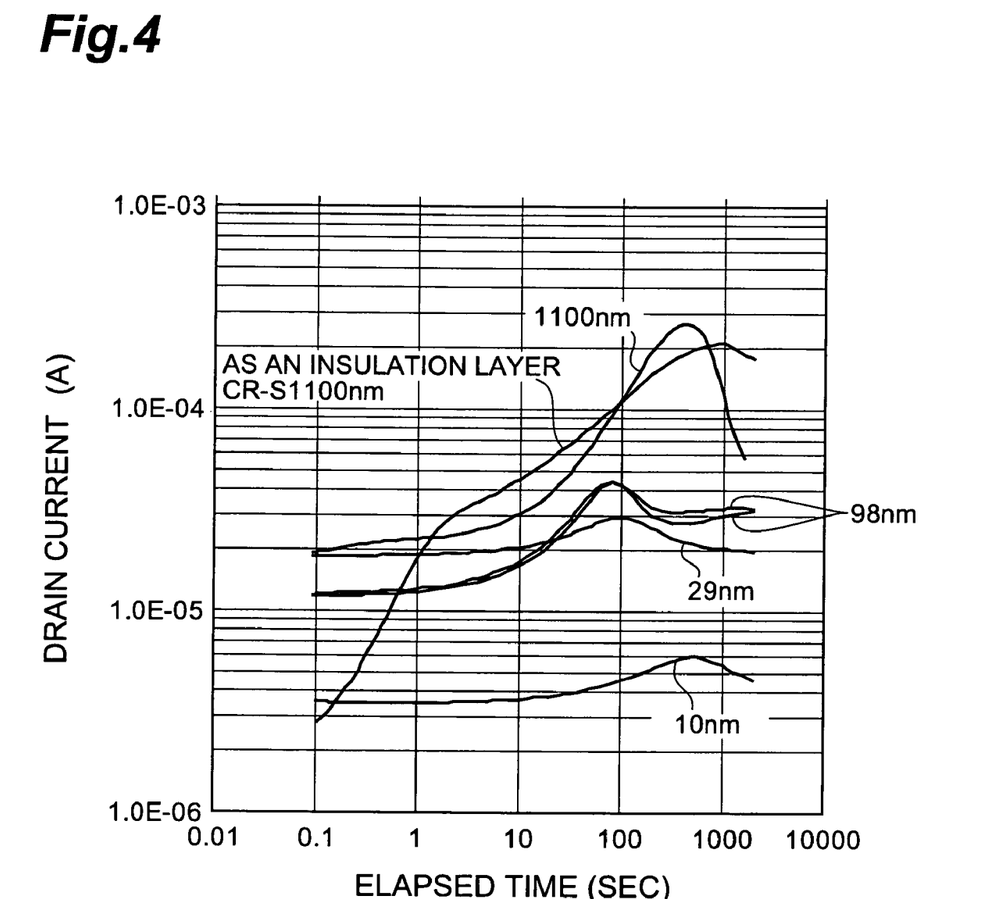
FIG. 4 is a graph showing the drain current-time characteristic of each organic FET obtained in an example 2 and a comparative example 2.
Figure 5:
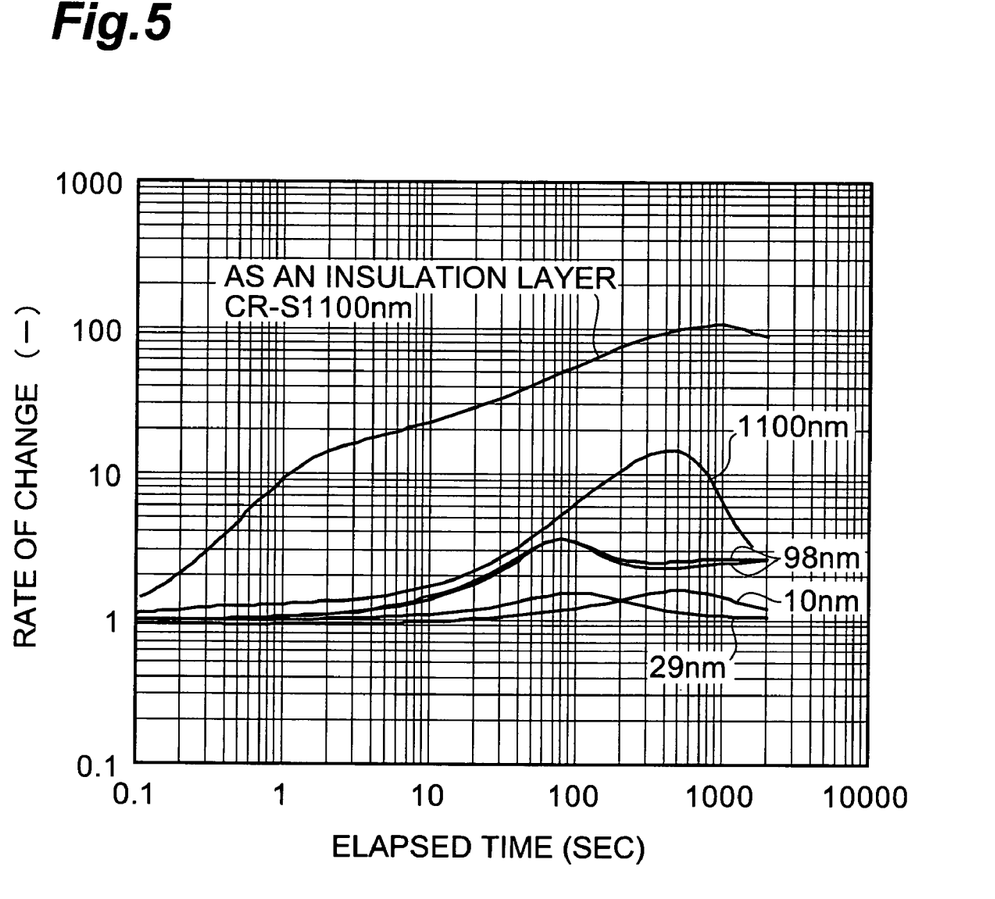
FIG. 5 is a graph showing the rate of change of the drain current values versus elapsed time, the drain current values being obtained by normalizing the drain currents shown in FIG. 4 to the initial values (drain currents when voltage is applied)

The drain current-time characteristic (I-t characteristic) of each organic FET obtained in the example 2 and in the comparative example 2 is measured by the above-mentioned method. The results are shown in FIG. 4. The values denoted in units of nm represent the thickness of the reformed layer (thickness of the CR-S layer as an insulation layer in the comparative example 2). FIG. 5 is a graph showing the change of the drain current value normalized to the initial value (drain current when voltage is applied), that is, the rate of change of the drain current with respect to elapsed time.

From these results, it can be understood that in the organic FET in the example 2, the rate of change of the drain current is reduced considerably compared to that in the comparative example 2. In the case where the thickness of the reformed layer is 1,100 nm, the rate of change when 100 seconds elapse after the gate voltage is applied becomes relatively large, and if the result of the organic FET having the different thickness of the reformed layer from that is taken into consideration, it can be estimated that in the case of the example 2, when the thickness of the reformed layer is about 500 nm, the rate of change (width) of the drain current with elapsed time tends to increase comparatively.

<Characteristic Evaluation 3>

Figure 6:
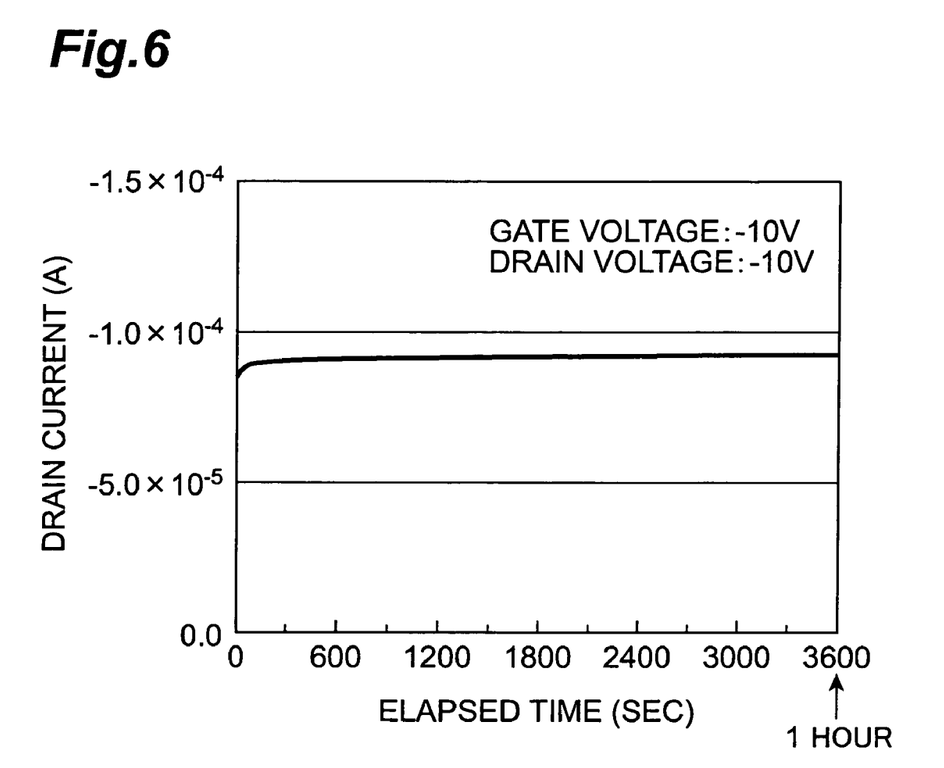
FIG. 6 is a graph showing the drain current-time characteristic of an organic FET in an example 3.
Figure 7:
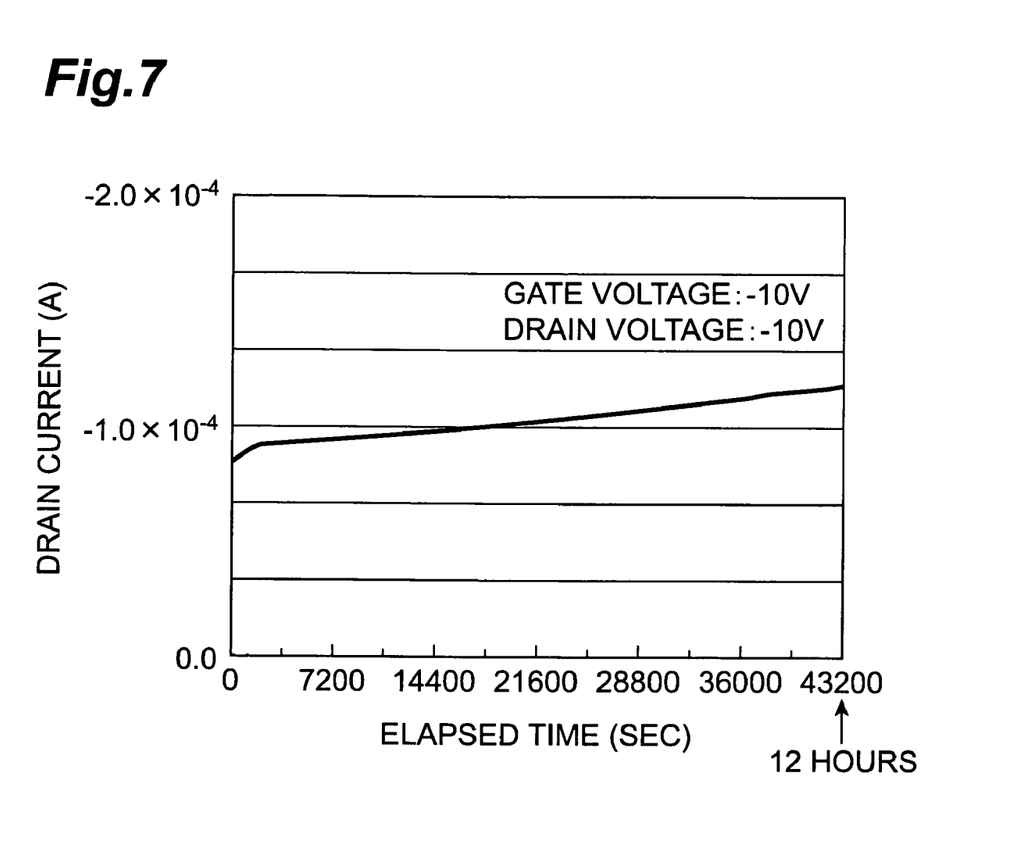
FIG. 7 is a graph showing the drain current-time characteristic of the organic FET in the example 3.

The drain current-time characteristic (I-t characteristic) of each organic FET obtained in the example 3 and in the comparative example 3 is measured by the above-mentioned method. The measurement is conducted under conditions that both the gate voltage and the drain voltage are −10V. FIG. 6 and FIG. 7 are graphs showing the drain current-time characteristic (I-t characteristic) of the organic FET in the example 3 and the dynamic range of the horizontal axis differs from each other. From these results, it is confirmed that in the organic FET in the example 3 according to the present invention, even when 12 hours elapse after the gate voltage is applied, a small rate of change of the drain current of about +30% compared to the initial value occurs.

Figure 8:
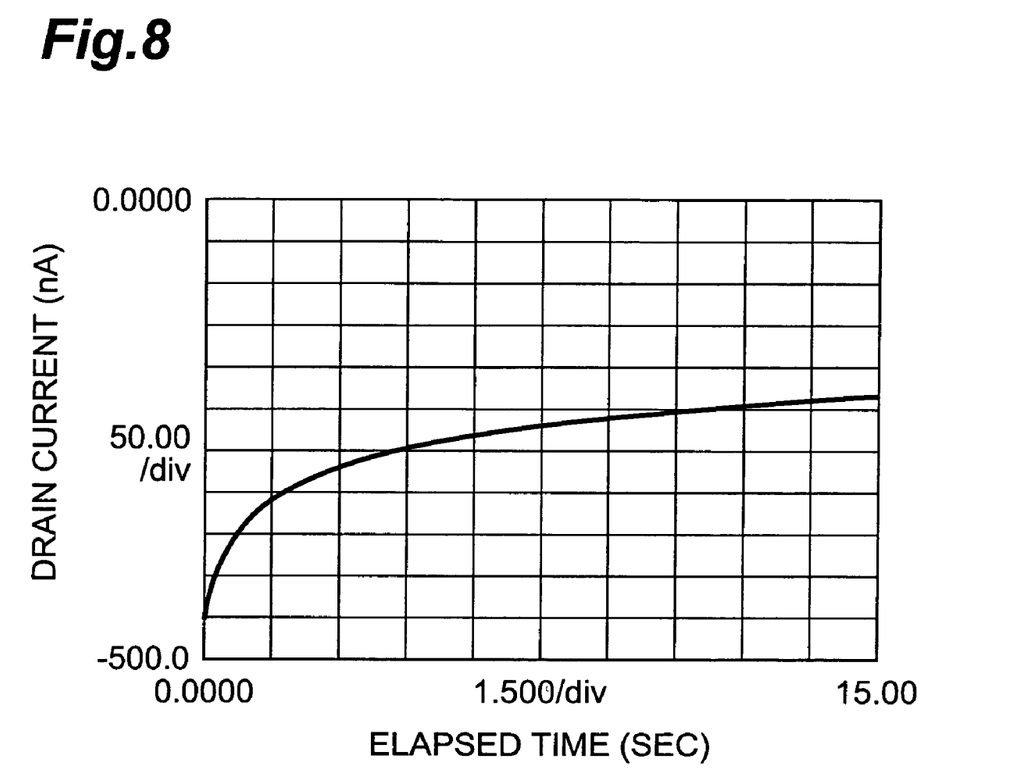
FIG. 8 is a graph showing the drain current-time characteristic of an organic FET in a comparative example 3.

On the other hand, FIG. 8 is a graph showing the drain current-time characteristic (I-t characteristic) of the organic FET obtained in the comparative example 3. The dynamic range of the horizontal axis in FIG. 8 is about 15 seconds and it can be understood that the rate of change of the drain current in an extremely short time in the organic FET in the comparative example 3 is incommensurably greater than that shown in FIG. 6 and FIG. 7.

INDUSTRIAL APPLICABILITY

The present invention can be used for a field-effect transistor (FET) and, more particularly, for an FET comprising a semiconductor layer containing organic substances.

What is claimed is:

1. A field-effect transistor comprising:
a gate electrode formed at one side of a base substrate;
a source electrode formed at the one side of the base substrate;
a drain electrode formed at the one side of the base substrate;
an insulation layer formed between the gate electrode and the source electrode and between the gate electrode and the drain electrode;
an organic semiconductor layer formed around the source electrode and the drain electrode; and
a reformed layer attached between the insulation layer and the organic semiconductor layer and containing a compound having the CN group in a molecule,
wherein the compound having the CN group in a molecule contained in or making up the reformed layer is expressed by the following chemical formula:
(Chemical formula 1)

(in the chemical formula 1, $R^1$ represents the alkylene group or the polymethylene group whose carbon number k is 1 to 20 and the alkylene group and the polymethylene group may have an ether linkage, n represents an integer of 1 to 2k, $R^2$, $R^3$, and $R^4$ each represents an organic group whose carbon number is 1 to 20 independently of each other and at least one of $R^2$, $R^3$, and $R^4$ is the alkoxy group whose carbon number is 1 to 5 or the alkylamino group having an alkyl chain whose carbon number is 1 to 20, and M represents at least one kind of atom of Si, Ti, and Al, and when M is Si or T, m=1 and when M is Al, m=0).

2. The field-effect transistor according to claim 1, wherein the compound having the CN group in a molecule contained in or making up the reformed layer is 2-cyanoethyltriethoxy silane.

3. The field-effect transistor according to claim 1, wherein the concentration of the compound having the CN group in a molecule contained in the reformed layer is less than 50 mass%.

4. The field-effect transistor according to claim 1, wherein the thickness of the reformed layer is 0.5 to 500 nm.

5. The field-effect transistor according to claim 1, wherein $C_{min}$ representing the minimum value of the electrostatic capacitance in the electrostatic capacitance-gate voltage characteristic of the field-effect transistor and $C_{max}$ representing the maximum value of the electrostatic capacitance in the electrostatic capacitance-gate voltage characteristic of the field-effect transistor satisfy the following expression:

$$C_{max} \leq C_{min} \times 2.$$

6. The field-effect transistor according to claim 1, wherein the curve of the rate of change of the drain current obtained from the drain current-time characteristic has a local extreme value, the first derivative is substantially positive, or the rate of change exceeds 1 when 10 seconds elapse after the gate voltage is applied.

7. A field-effect transistor comprising:
a gate electrode formed at one side of a base substrate;
a source electrode formed at the one side of the base substrate;
a drain electrode formed at the one side of the base substrate;
an insulation layer formed between the gate electrode and the source electrode and between the gate electrode and the drain electrode;
an organic semiconductor layer formed around the source electrode and the drain electrode; and
a reformed layer attached between the insulation layer and the organic semiconductor layer and composed of only a compound having the CN group in a molecule,
wherein the compound having the CN group in a molecule contained in or making up the reformed layer is expressed by the following chemical formula:

(Chemical formula 1)

(in the chemical formula 1, $R^1$ represents the alkylene group or the polymethylene group whose carbon number k is 1 to 20 and the alkylene group and the polymethylene group may have an ether linkage. n represents an integer of 1 to 2k, $R^2$, $R^3$, and $R^4$ each represents an organic group whose carbon number is 1 to 20 independently of each other and at least one of $R^2$, $R^3$, and $R^4$ is the alkoxy group whose carbon number is 1 to 5 or the alkylamino group having an alkyl chain whose carbon number is 1 to 20, and M represents at least one kind of atom of Si, Ti, and Al, and when M is Si or T, m=1 and when M is Al, m=0).

8. The field-effect transistor according to claim 7, wherein an hydroxyl group is introduced to a surface or a surface layer of the insulation layer.

9. The field-effect transistor according to claim 7, wherein the compound having the CN group in a molecule contained in or making up the reformed layer is 2-cyanoethyltriethoxy silane.

10. The field-effect transistor according to claim 7, wherein $C_{min}$ representing the minimum value of the electrostatic capacitance in the electrostatic capacitance-gate voltage characteristic of the field-effect transistor and $C_{max}$ representing the maximum value of the electrostatic capacitance in the electrostatic capacitance-gate voltage characteristic of the field-effect transistor satisfy the following expression:

$$C_{max} \leq C_{min} \times 2.$$

11. The field-effect transistor according to claim 7, wherein the curve of the rate of change of the drain current obtained from the drain current-time characteristic has a local extreme value, the first derivative is substantially positive, or the rate of change exceeds 1 when 10 seconds elapse after the gate voltage is applied.

* * * * *